United States Patent
Hembree et al.

(10) Patent No.: US 6,642,730 B1
(45) Date of Patent: Nov. 4, 2003

(54) TEST CARRIER WITH MOLDED INTERCONNECT FOR TESTING SEMICONDUCTOR COMPONENTS

(75) Inventors: David R. Hembree, Boise, ID (US); Salman Akram, Boise, ID (US); Warren M. Farnworth, Nampa, ID (US); Alan G. Wood, Boise, ID (US); Derek Gochnour, Boise, ID (US); John O. Jacobson, Boise, ID (US); James M. Wark, Boise, ID (US); Syed Sajid Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/351,767

(22) Filed: Jan. 27, 2003

Related U.S. Application Data

(62) Division of application No. 09/677,555, filed on Oct. 2, 2000, which is a division of application No. 09/143,300, filed on Aug. 28, 1998, now Pat. No. 6,353,326.

(51) Int. Cl.[7] ............................................. G01R 31/02
(52) U.S. Cl. ........................................ 324/755; 324/765
(58) Field of Search ................................ 324/754–755, 324/757–758, 765, 767; 361/760, 785, 813; 257/666, 787

(56) References Cited

U.S. PATENT DOCUMENTS

| | | | |
|---|---|---|---|
| 4,682,270 A | 7/1987 | Whitehead et al. | |
| 4,815,595 A | 3/1989 | Bond et al. | |
| 5,006,792 A | 4/1991 | Malhi et al. | |
| 5,012,386 A | 4/1991 | McShane et al. | |
| 5,046,239 A | 9/1991 | Miller et al. | |
| 5,070,297 A | * 12/1991 | Kwon et al. | ................. 324/754 |
| 5,073,117 A | 12/1991 | Malhi et al. | |
| 5,088,190 A | 2/1992 | Malhi et al. | |
| 5,123,850 A | 6/1992 | Elder et al. | |
| 5,155,067 A | 10/1992 | Wood et al. | |
| 5,167,326 A | 12/1992 | Murphy | |
| 5,283,717 A | 2/1994 | Hundt | |
| 5,293,072 A | 3/1994 | Tsuji et al. | |
| 5,302,891 A | 4/1994 | Wood et al. | |
| 5,344,600 A | 9/1994 | McShane et al. | |
| 5,360,348 A | 11/1994 | Johnson | |
| 5,367,253 A | 11/1994 | Wood et al. | |
| 5,399,903 A | 3/1995 | Rostoker et al. | |
| 5,400,220 A | 3/1995 | Swamy | |
| 5,408,190 A | 4/1995 | Wood et al. | |
| 5,440,240 A | 8/1995 | Wood et al. | |
| 5,441,684 A | 8/1995 | Lee | |

(List continued on next page.)

OTHER PUBLICATIONS

Tummala, Rao R. and Rymaszewski, Eugene J., *Micro–electronics Packaging Handbook*, 1989 Van Nostrand Reinhold, New York, pp. 898–921. (no month).

*Primary Examiner*—Kamand Cuneo
*Assistant Examiner*—Minh N. Tang
(74) *Attorney, Agent, or Firm*—Stephen A. Gratton

(57) ABSTRACT

A semiconductor carrier for testing semiconductor components, such as bare dice and chip scale packages, and a method for fabricating the carrier are provided. The carrier includes a molded plastic base, a lead frame, and an interconnect. The interconnect includes contacts for making temporary electrical connections with corresponding contacts (e.g., bond pads, solder balls) on the components. The carrier is fabricated by attaching the interconnect to the lead frame, and then molding the plastic base to the interconnect and lead frame. An alternate embodiment carrier includes a board to which multiple interconnects are molded or laminated. In addition, clip members retain the components on the board in electrical communication with the interconnects.

24 Claims, 6 Drawing Sheets

U.S. PATENT DOCUMENTS

| | | | |
|---|---|---|---|
| 5,451,165 A | 9/1995 | Cearley-Cabbiness et al. | |
| 5,483,741 A | 1/1996 | Akram et al. | |
| 5,495,179 A | 2/1996 | Wood et al. | |
| 5,519,332 A | 5/1996 | Wood et al. | |
| 5,541,525 A | 7/1996 | Wood et al. | |
| 5,543,725 A | 8/1996 | Lime et al. | |
| 5,557,145 A | 9/1996 | Kobayashi et al. | |
| 5,563,446 A | 10/1996 | Chia et al. | |
| 5,568,057 A | 10/1996 | Kim et al. | |
| 5,572,140 A | 11/1996 | Lim et al. | |
| 5,578,934 A | 11/1996 | Wood et al. | |
| 5,607,059 A | 3/1997 | Kitamura et al. | |
| 5,622,873 A | 4/1997 | Kim et al. | |
| 5,633,122 A | 5/1997 | Tuttle | |
| 5,634,267 A | 6/1997 | Farnworth et al. | |
| 5,644,247 A | 7/1997 | Hyun et al. | |
| 5,647,121 A | 7/1997 | McLellan et al. | |
| 5,666,064 A | 9/1997 | Kasai et al. | |
| 5,686,317 A | 11/1997 | Akram et al. | |
| 5,691,649 A | 11/1997 | Farnworth et al. | |
| 5,701,666 A * | 12/1997 | DeHaven et al. | 324/754 |
| 5,721,496 A | 2/1998 | Farnworth et al. | |
| 5,739,050 A | 4/1998 | Farnworth | |
| 5,742,169 A | 4/1998 | Akram et al. | |
| D394,844 S | 6/1998 | Farnworth et al. | |
| 5,783,461 A | 7/1998 | Hembree | |
| 5,796,264 A | 8/1998 | Farnworth et al. | |
| 5,815,000 A | 9/1998 | Farnworth | |
| 5,825,195 A | 10/1998 | Hembree et al. | |
| 5,834,945 A | 11/1998 | Akram et al. | |
| 5,844,418 A | 12/1998 | Wood et al. | |
| 5,878,485 A | 3/1999 | Wood et al. | |
| 5,896,036 A | 4/1999 | Wood et al. | |
| 5,915,977 A | 6/1999 | Hembree et al. | |
| 5,929,647 A | 7/1999 | Akram et al. | |
| 5,931,685 A | 8/1999 | Hembree et al. | |
| 5,962,921 A | 10/1999 | Farnworth et al. | |
| 5,982,185 A | 11/1999 | Farnworth | |
| 6,005,401 A * | 12/1999 | Nakata et al. | 324/754 |
| 6,016,060 A | 1/2000 | Akram et al. | |
| 6,018,249 A | 1/2000 | Akram et al. | |
| 6,025,728 A | 2/2000 | Hembree et al. | |
| 6,025,731 A | 2/2000 | Hembree et al. | |
| 6,040,702 A | 3/2000 | Hembree et al. | |
| 6,060,893 A | 5/2000 | Farnworth et al. | |
| 6,060,894 A | 5/2000 | Hembree et al. | |
| 6,072,323 A | 6/2000 | Hembree et al. | |
| 6,072,326 A | 6/2000 | Akram et al. | |
| 6,091,251 A | 7/2000 | Wood et al. | |
| 6,091,252 A | 7/2000 | Akram et al. | |
| 6,094,058 A | 7/2000 | Hembree et al. | |
| 6,107,109 A | 8/2000 | Akram et al. | |
| 6,175,241 B1 | 1/2001 | Hembree et al. | |
| 6,222,280 B1 | 4/2001 | Farnworth et al. | |
| 6,222,379 B1 | 4/2001 | Farnworth et al. | |
| 6,229,202 B1 | 5/2001 | Corisis | |
| 6,242,931 B1 | 6/2001 | Hembree et al. | |
| 6,242,935 B1 | 6/2001 | Akram | |
| 6,246,110 B1 | 6/2001 | Kinsman et al. | |
| 6,255,833 B1 | 7/2001 | Akram et al. | |
| 6,255,840 B1 | 7/2001 | Hembree et al. | |
| 6,258,609 B1 | 7/2001 | Farnworth et al. | |
| 6,329,606 B1 | 12/2001 | Freyman et al. | |
| 6,340,894 B1 | 1/2002 | Farnworth et al. | |
| 6,353,326 B2 | 3/2002 | Hembree et al. | |
| 6,369,600 B2 | 4/2002 | Farnworth et al. | |
| 6,383,825 B1 | 5/2002 | Farnworth et al. | |
| 6,392,429 B1 | 5/2002 | Hembree et al. | |

* cited by examiner

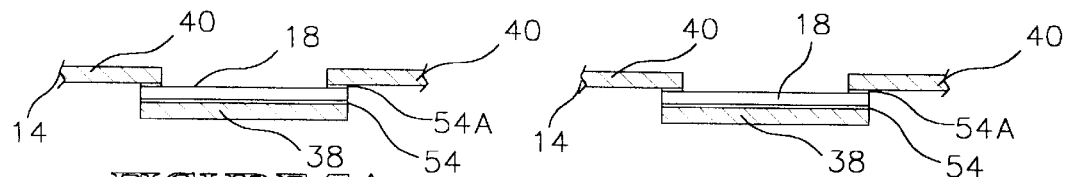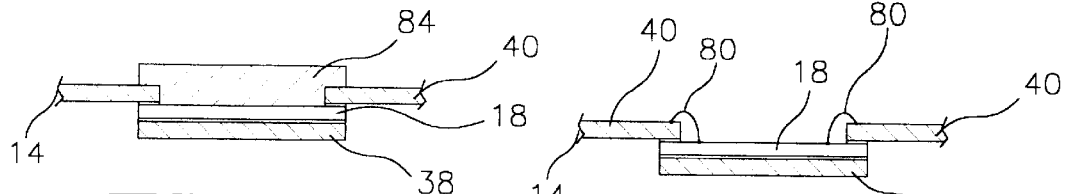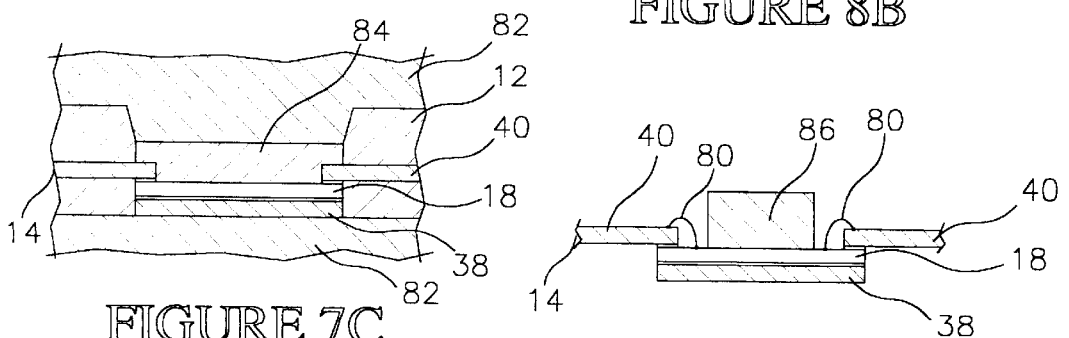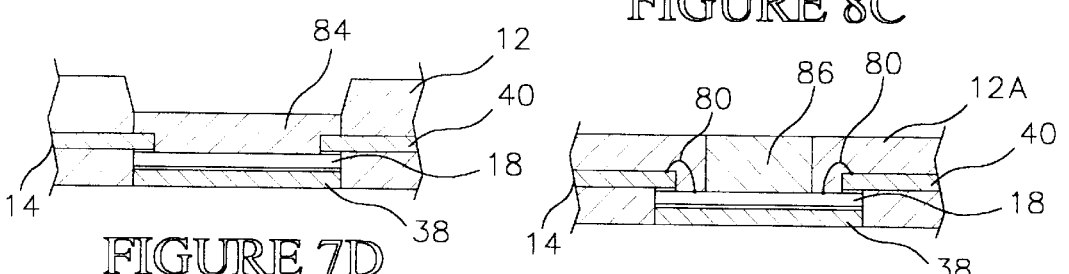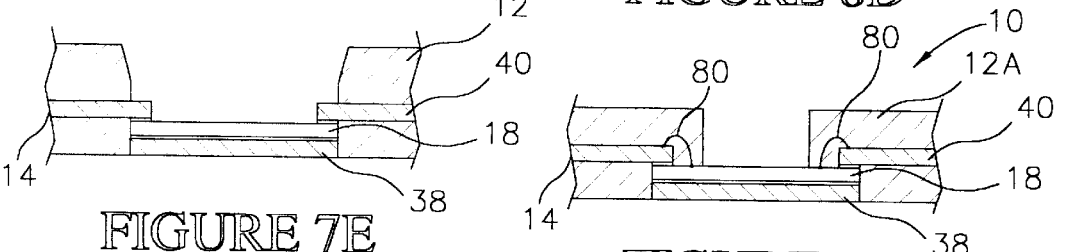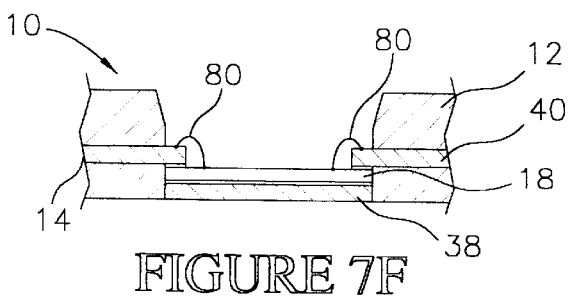

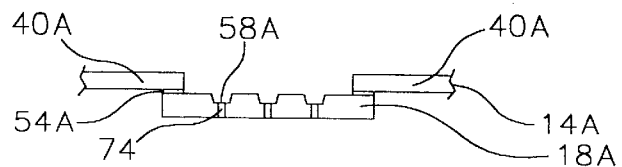
FIGURE 9A
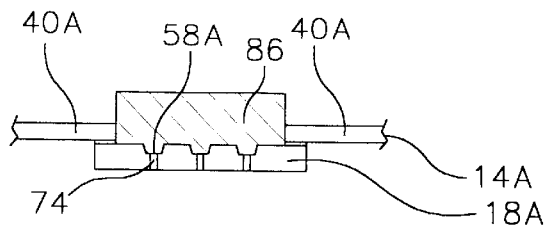
FIGURE 9B
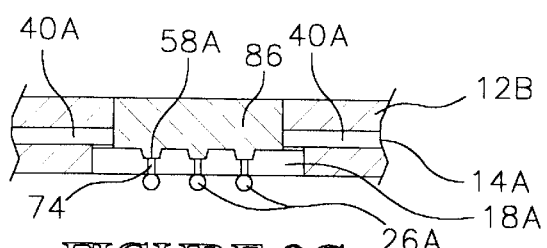
FIGURE 9C
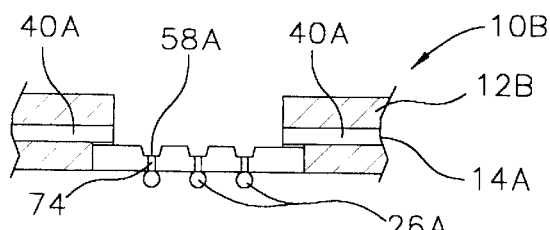
FIGURE 9D
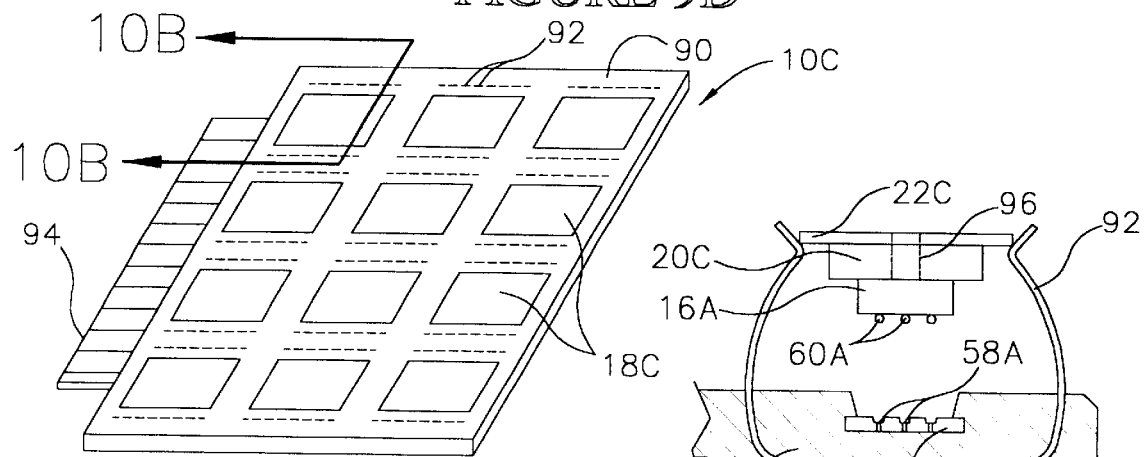
FIGURE 10A
FIGURE 10B

TEST CARRIER WITH MOLDED INTERCONNECT FOR TESTING SEMICONDUCTOR COMPONENTS

CROSS REFERENCE TO RELATED APPLICATIONS

This application is a division of Ser. No. 09/677,555 filed on Oct. 2, 2000, which is a division of Ser. No. 09/143,300 filed on Aug. 28, 1998, Pat. No. 6,353,326 B2.

FIELD OF THE INVENTION

This invention relates generally to semiconductor manufacture, and more particularly to an improved test carrier for temporarily packaging and testing semiconductor components, such as dice and chip scale packages. This invention also relates to a test system incorporating the carrier, and to a method for fabricating the carrier.

BACKGROUND OF THE INVENTION

Semiconductor components, such as bare dice and chip scale packages must be tested prior to shipment by semiconductor manufacturers. Since these components are relatively small and fragile, carriers have been developed for temporarily packaging the components for testing. The carriers permit electrical connections to be made between external contacts on the components, and testing equipment such as burn-in boards. On bare dice, the external contacts typically comprise planar or bumped bond pads. On chip scale packages, the external contacts typically comprise solder balls in a dense array, such as a ball grid array, or a fine ball grid array.

An interconnect on the carrier includes contacts that make the temporary electrical connections with the external contacts on the components. The interconnect must provide power, ground and signal paths to the component. As the external contacts on the components become smaller and denser, it becomes more difficult to fabricate the carrier with the required number of electrical paths to the interconnect.

Also, the carrier must be reused multiple times in a production environment. Accordingly, it is desirable to make the carrier as damage resistant as possible. Incorporating the interconnect into the carrier, while maintaining a compact outline for the carrier is increasingly difficult. In addition, the fabrication process for the carrier must be capable of producing production quantities at reasonable costs. It would be advantageous to have the capability to fabricate carriers using conventional semiconductor fabrication processes. This would lower initial capital outlays for production equipment, and lower production costs.

In view of the foregoing, improved carriers for testing semiconductor components including unpackaged dice, and chip scale packages are needed. Also needed are improved fabrication processes for carriers. In particular, carriers which can be constructed at low costs, using standard fabrication equipment, are needed.

SUMMARY OF THE INVENTION

In accordance with the present invention, an improved test carrier, and a method for fabricating the carrier, are provided. The test carrier can be used to temporarily package and test semiconductor components, such as bare dice, and chip scale packages.

The test carrier includes a base for retaining one or more components, and a lead frame molded to the base. The lead frame includes lead fingers which form internal signal traces and terminal contacts for the carrier. The carrier also includes an interconnect, which is attached to a mounting paddle of the lead frame and molded to the base.

The interconnect includes contacts for electrically contacting external contacts on the component under test. The interconnect contacts are electrically connected to the lead fingers of the lead frame by wire bonding. For components with planar external contacts, such as bond pads on bare dice, the interconnect contacts can comprise etched pillars with penetrating projections. Alternately, for planar external contacts, the interconnect contacts can comprise microbumps on a polymer film. For components with bumped contacts, such as chip scale packages having solder balls, the interconnect contacts can comprise recesses, or flat pads, covered with conductive layers.

The carrier also includes a force applying mechanism for biasing the component against the interconnect. The force applying mechanism includes a biasing member, such as a compressible elastomeric spring. The force applying mechanism also includes a lid, and one or more clips, which attach to the carrier base.

In an alternate embodiment, multiple interconnects can be molded to a board having integrally formed clip members. In another alternate embodiment laser machined conductive vias in the interconnect provide electrical paths for external contacts formed directly on the interconnect.

The method for fabricating the carrier includes the initial step of attaching the interconnect to the lead frame. Following attachment, an elastomeric gasket can be placed on the interconnect and lead frame, to protect the interconnect, and portions of the lead fingers wherein wire bonds will be formed. Alternately, in place of an elastomeric gasket, a polymer layer, such as a thick film resist, can be applied to the interconnect prior to molding. During a molding step, the carrier base is molded to the lead frame and interconnect. Next, the gasket is removed, or the polymer layer is stripped, and the interconnect is wire bonded to the lead fingers. As another alternate wiring bonding can precede molding, and the wire bonds can be encapsulated. Finally, a trim and form step is performed to form exposed portions of the lead fingers into the terminal leads of the carrier.

A test system constructed in accordance with the invention includes the carrier and test circuitry. The test circuitry generates and transmits test signals through the carrier to the component, and evaluates the resultant signals. The test system can also include a burn-in board which provides electrical interface between the carrier and test circuitry.

BRIEF DESCRIPTION OF THE DRAWINGS

FIGS. 7A–7F are schematic cross sectional views illustrating steps in a method for fabricating the carrier in accordance with the invention;

FIGS. 8A–8E are schematic cross sectional views illustrating steps in a method for fabricating an alternate embodiment carrier;

FIGS. 9A–9D are schematic cross sectional views illustrating steps in a method for fabricating another alternate embodiment carrier;

FIG. 10A is a schematic perspective view of an alternate embodiment carrier; and FIG. 10B is a cross sectional view taken along section line 10B—10B of FIG. 10A.

DETAILED DESCRIPTION OF THE PREFERRED EMBODIMENTS

Figure 1:
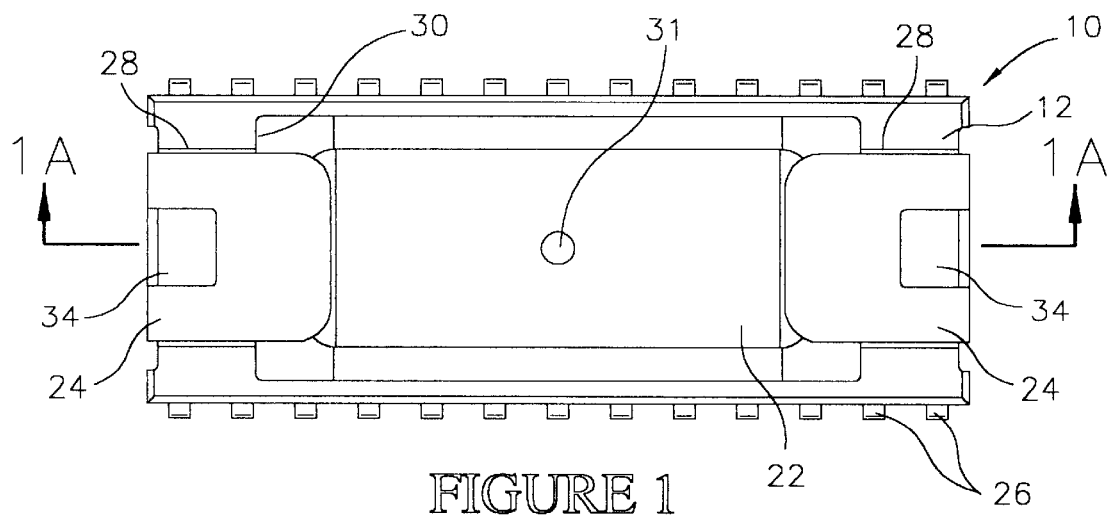
FIG. 1 is a plan view of a test carrier constructed in accordance with the invention.
Figure 1A:
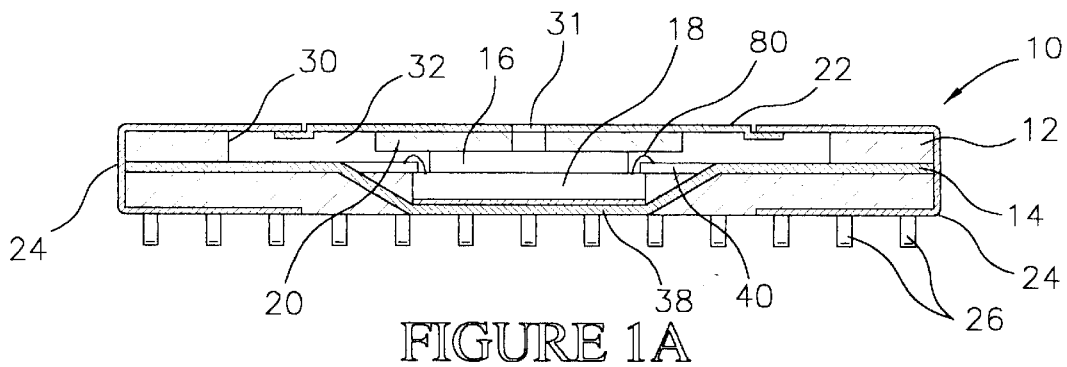
FIG. 1A is a cross sectional view taken along section line 1A—1A of FIG. 1.
Figure 2:
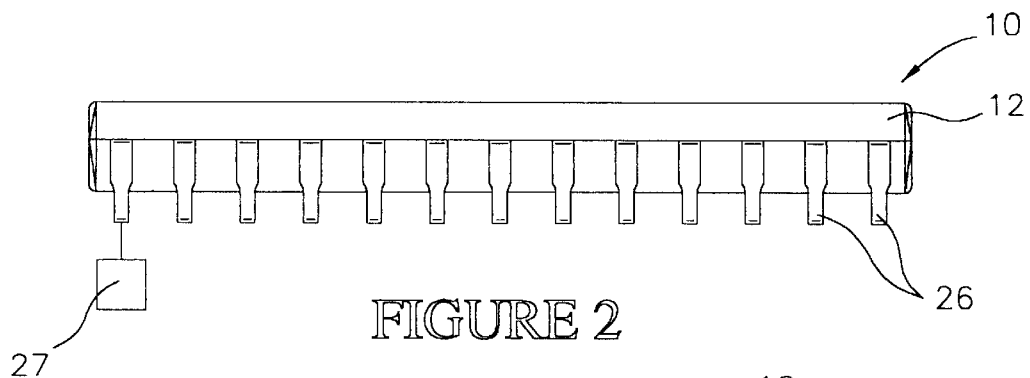
FIG. 2 is a side elevation view of the carrier.
Figure 3:
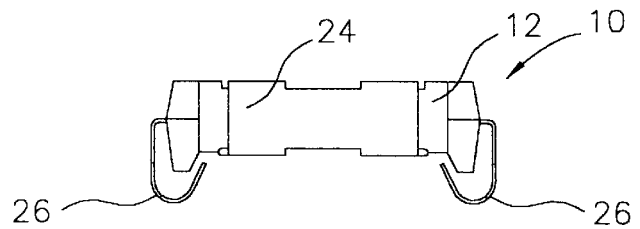
FIG. 3 is an end view of the carrier.

Referring to FIGS. 1–3, a test carrier 10 constructed in accordance with the invention is illustrated. The carrier 10 is adapted to temporarily package a semiconductor component 16 (FIG. 1A) for testing and burn-in.

The carrier 10 includes a base 12, a lead frame 14 (FIG. 1A) and an interconnect 18 (FIG. 1A). As will be further explained, the lead frame 14 and interconnect 18 are molded to the base 12. The carrier 10 also includes a force applying mechanism comprising a spring 20 (FIG. 1A), a lid 22 and a pair of clips 24. In addition, the carrier 10 includes a plurality of terminal leads 26 in electrical communication with the interconnect 18.

As will be further explained, the terminal leads 26 comprise trimmed and formed portions of the lead frame 14. Further, the terminal leads 26 are adapted for electrical communication with test circuitry 27 (FIG. 2) of a test system. The test circuitry 27 generates test signals, and transmits the test signals to the terminal leads 26 and through the interconnect 18 to the component 16. The test circuitry 27 also analyzes the resultant test signals transmitted from the component 16. This permits various electrical characteristics of the component 16 to be evaluated.

The carrier base 12 and terminal leads 26 have a configuration (i.e., size, peripheral outline, external leads) corresponding to that of a conventional semiconductor package. In the illustrative embodiment, the carrier base 12 has the configuration of a small outline j-bend (SOJ) package. Alternately, the carrier base 12 can have the configuration of other conventional packages such as single in line memory module (SIMM), dual in line package (DIP), quad flat pack (QFP), zig zag in line package (ZIP), or leadless chip carrier (LCC). This permits the carrier 10 to be utilized with conventional equipment such as burn-in boards, carrier trays, and handling equipment associated with conventional semiconductor packages. In the illustrative embodiment in the SOJ configuration, the terminal leads 26 are located on opposing sides of the carrier base 12. However, for other configurations the terminal leads 26 can be located on more than two sides (e.g., three sides, four sides).

Alternately, rather than having terminal leads 26 formed as dual in line pins, other configurations for the leads 26 can be provided. For example, the carrier base 12 can include solder balls in a ball grid array (BGA) or fine ball grid array (FBGA), or pins in a pin grid array (PGA). The carrier base 12 and terminal leads 26 can also have a specialized configuration different than conventional semiconductor packages. The carrier base 12 is formed of plastic using a conventional injection molding process. Exemplary plastics include epoxy novolac resin, silicone, phenylsilane and thermoset plastics. The carrier base 12 includes channels 28 on either end for receiving the clips 24. The carrier base 12 also includes a recess 30. With the lid 22 attached to the carrier base 12 the recess 30 forms an enclosed cavity 32 (FIG. 1A) for the component 16 and spring 20. Also, with the lid 22 attached to the carrier base 12, the component 16. is pressed by the spring 20 against the interconnect 18.

The lid 22 and clips 24 are sized and shaped for mating physical engagement. In addition, the clips 24 include rectangular openings 34 (FIG. 1) which permit handling by a manual or automated tool. Preferably the clips 24 comprise a resilient metal or plastic material.

The spring 20 can comprise a resilient elastomeric material such as silicone, butyl rubber, or fluorosilicone. Suitable elastomeric materials include "PORON" available from a Rogers Corporation subsidiary of Elkgrove Village, Ill. If desired, the elastomeric spring 20 can be secured to the lid 22 using an adhesive such as silicone. Rather than being formed of elastomeric materials, the spring 20 can comprise a resilient metal such as a belleville washer, or spring segment. Alternately, the spring 20 can comprise a compressible gas or liquid filled bladder. This type of bladder is available from Paratech of Frankfort, Ill under the trademark "MAXI FORCE AIR BAG".

Assembly of the carrier 10, with the component 16 therein, can be accomplished by attaching the component 16 to the lid 22 and spring 20. The lid 22 and spring 20 can include a vacuum conduit 31 to enable attachment of the component 16 using a vacuum tool (not shown). The component 16 can then be aligned with the interconnect 18 and placed in contact therewith. Optical alignment techniques can be used during assembly of the carrier 10. U.S. Pat. No. 5,541,525 entitled "Carrier For Testing An Unpackaged Semiconductor Die", which is incorporated herein by reference, describes a method for assembling the carrier 10 using optical alignment.

Figure 4:
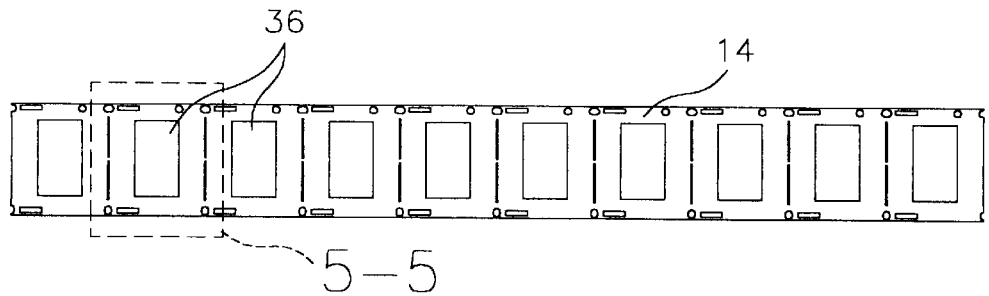
FIG. 4 is a schematic plan view of a lead frame configured for fabricating multiple carriers.
Figure 5:
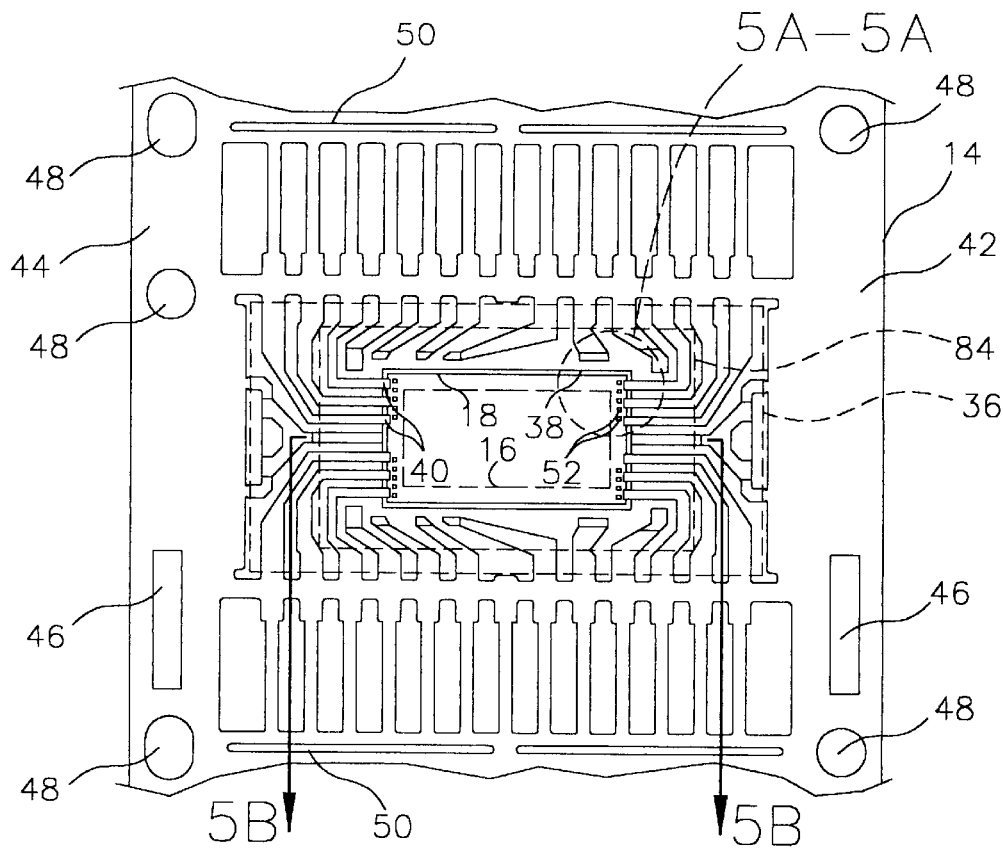
FIG. 5 is an enlarged plan view taken along section line 5—5 of FIG. 4 of a portion of the lead frame.

Referring to FIGS. 4 and 5, the lead frame 14 is shown prior to formation of the carrier base 12. The lead frame 14 initially comprises a strip of material which includes multiple interconnect mounting sites 36 (FIG. 4). In an illustrative embodiment the lead frame 14 includes ten interconnect mounting sites 36. However, this number is merely exemplary, and a greater or lesser number of interconnect mounting sites 36 can be employed. Each interconnect mounting site 36 can be used to mount an interconnect 18 to form a single carrier base 12. Following a molding step in which the carrier bases 12 are molded to the interconnects 18, the lead frame 14 can be cut or sheared into a plurality of separate bases 12. Each carrier base 12 includes an integrally molded interconnect 18 substantially as shown in FIG. 1A.

As shown in FIG. 5, the lead frame 14 includes parallel spaced side rails 42, 44 having multiple through openings 46, 48. The side rails 42, 44 and openings 46, 48 permit the lead frame 14 to be handled by automated transfer mechanisms associated with chip bonders, wire bonders, molds, trim and form machinery, and marking machinery. The lead frame 14 also include elongated openings 50 to facilitate singulation of the lead frame 14 into separate carriers 10. The lead frame 14 can be formed of metal using a stamping process, or a chemical milling process. Suitable metals for the lead frame 14 include nickel-iron alloys (e.g., 42% Ni-58% Fe), clad materials (e.g., copper clad stainless steel), or copper alloys.

As also shown in FIG. 5, each interconnect mounting site 36 includes a down set mounting paddle 38. In addition, each interconnect mounting site 36 includes a pattern of lead fingers 40. Following the molding step, wires 80 (FIG. 1A) will be wire bonded to the lead fingers 40 and to bonding pads 52 on the interconnect 18. The lead fingers 40 will form the internal signal traces for the carrier 10. Also, terminal portions of the lead fingers 40 will be trimmed and formed to form the terminal leads 26 (FIG. 1) of the carrier 10.

Figure 5A:
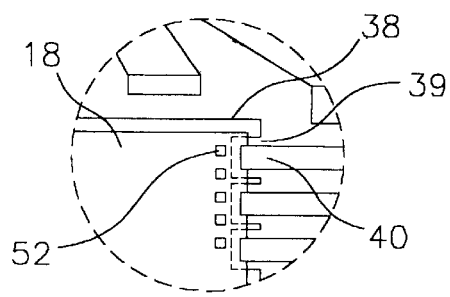
FIG. 5A is an enlarged plan view partially cut away taken along section line 5A—5A of FIG. 5.

Some of the lead fingers 40 can overlap the interconnect 18 to provide increased structural rigidity for supporting the interconnect 18 in the molded base 12. As shown in FIG. 5A, the mounting paddle 38 can include cut outs 39 to accommodate formation of the overlapping lead fingers 40 during stamping or etching of the lead frame 14.

Figure 5B:
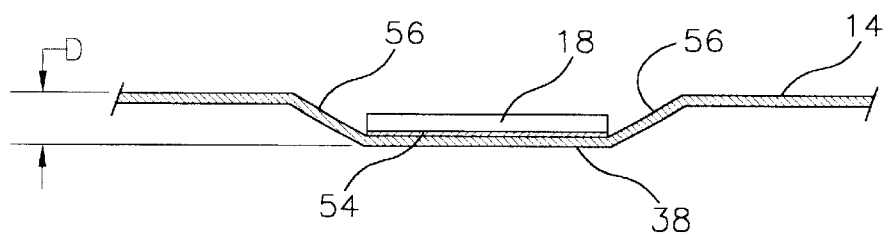
FIG. 5B is a cross sectional view of the lead frame and interconnect taken along section line 5B—5B of FIG. 5.

As shown in FIG. 5B, the mounting paddle 38 includes a planar surface configured to support the interconnect 18. During attachment of the interconnect 18 to the lead frame 14, a backside of the interconnect 18 can be adhesively bonded to the mounting paddle 38. Accordingly, the mounting paddle 38 has a peripheral shape which corresponds to a peripheral shape of the interconnect 18. In the illustrative embodiment the mounting paddle 38 has a generally rectangular peripheral shape. However, the mounting paddle 38 can also be configured in other peripheral shapes, such as square. A peripheral size of the mounting paddle 38 can be slightly larger than a peripheral size of the interconnect 18.

The interconnect 18 can be attached to the mounting paddle 38 using an adhesive layer 54. The adhesive layer 54 can comprise an epoxy, acrylic, silicone or polyimide material. Alternately, the adhesive layer 54 can comprise a polymer tape, such as "KAPTON" tape manufactured by DuPont. For attaching the interconnect 18 to the mounting paddle 38 a manual or automated process can be employed. For an automated process, a conventional chip bonder used in the production of conventional semiconductor packages for bonding dice to lead frames can be utilized.

Still referring to FIG. 5B, the mounting paddle 38 includes downset segments 56 which connect the mounting paddle to the siderails 42, 44 (FIG. 5) of the lead frame 14. A downset D of the mounting paddle 38 provides an offset for the mounting paddle 38 relative to the lead fingers 40. This facilitates molding of the interconnect 18 into the plastic base 12, and embeds the interconnect 18 within the molded plastic material of the base 12. In addition, as shown in FIG. 1A, the downset mounting paddle 38 forms an exposed bottom surface of the base 12. During a test procedure using the package 10, the exposed surface of the mounting paddle 38 improves heat transfer from the interconnect 18.

Figure 6:
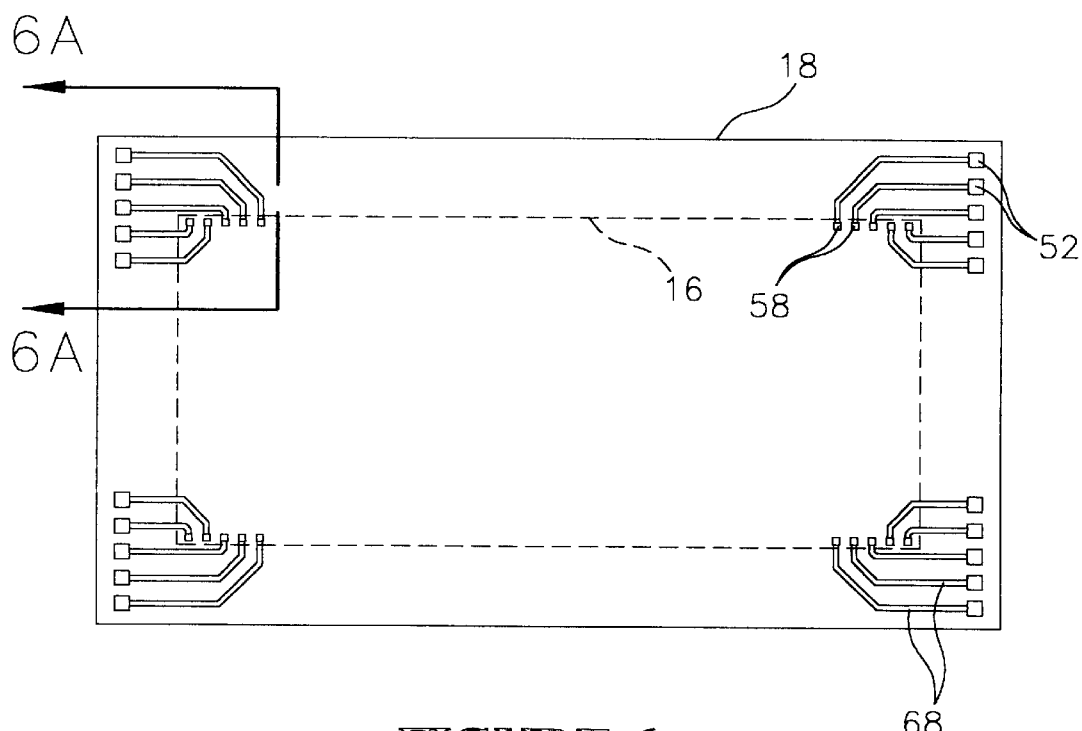
FIG. 6 is an enlarged plan view of an interconnect of the carrier with a component under test superimposed thereon.
Figure 6A:
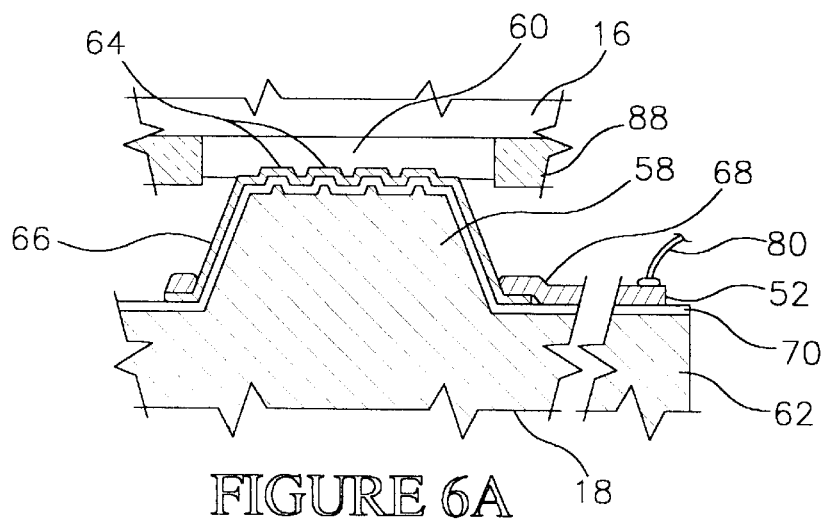
FIG. 6A is an enlarged cross sectional view taken along section line 6A—6A of FIG. 6, illustrating an interconnect contact electrically engaging a component contact.

Referring to FIGS. 6 and 6A, the interconnect 18 is illustrated separately. The interconnect 18 includes patterns of interconnect contacts 58 which are configured to electrically connect to contacts 60 (FIG. 6A) on the component 16. By way of example, the component contacts 60 can comprise thin film bond pads, test pads or fuse pads on a bare die. In this case, the component contacts 60 are embedded in a passivation layer 88.

The interconnect contacts 58 can be formed integrally with a substrate 62 of the interconnect 18. Preferably, the substrate 62 comprises silicon, such that a coefficient of thermal expansion (CTE) of the interconnect 18 matches that of components 16 formed of silicon. Alternately, germanium, a glass material, or a ceramic material, can be used as the substrate material.

The interconnect contacts 58 include penetrating projections 64 adapted to penetrate the component contacts 60 to a limited penetration depth. In addition, the interconnect contacts 58 include conductive layers 66 adapted to electrically contact the component contacts 60. The conductive layers 66 are in electrical communication with patterns of conductors 68 formed on a surface of the substrate 62. The conductors 68 include, or are in electrical communication with, the bond pads 52. An insulating layer 70 is formed on the substrate 62 to electrically insulate the conductors 68 and conductive layers 66 from a bulk of the substrate 62. Further details of the interconnect 18, including methods of fabrication, are disclosed in U.S. Pat. No. 5,483,741, entitled "Method For Fabricating A Self Limiting Silicon Based Interconnect For Testing Bare Semiconductor Dice", and U.S. Pat. No. 5,686,317, entitled "Method For Fabricating An Interconnect Having A Penetration Limited Contact Structure For Establishing A Temporary Electrical Connection With A Semiconductor Die", both of which are incorporated herein by reference.

Figure 6B:
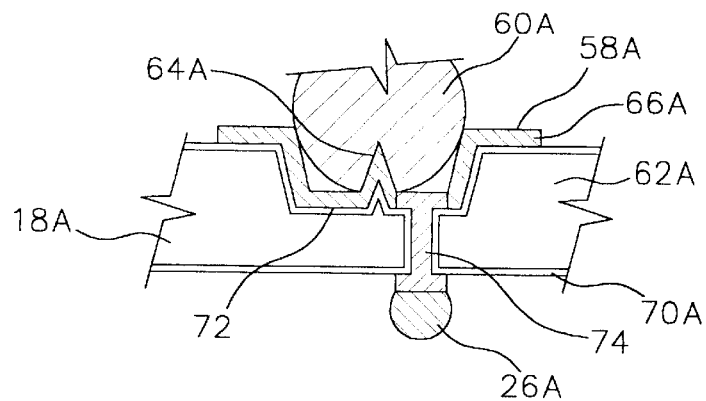
FIG. 6B is an enlarged cross sectional view equivalent to FIG. 6A of an alternate embodiment interconnect contact.
Figure 6C:
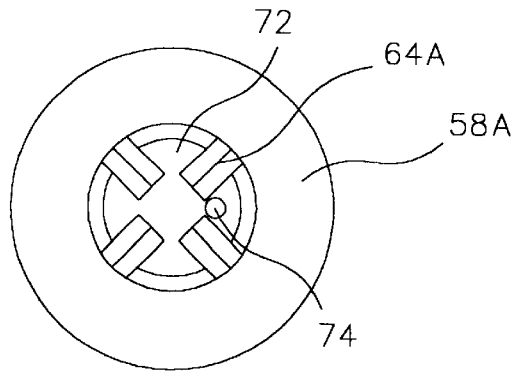
FIG. 6C is a plan view of the interconnect contact of FIG. 6B.

Referring to FIGS. 6B and 6C, an alternate embodiment interconnect 18A having interconnect contacts 58A is illustrated. The interconnect contacts 58A are adapted to form electrical connections with bumped component contacts 60A. For example, the bumped component contacts 60A can comprise solder balls on a bumped die or chip scale package.

The interconnect contacts 58A comprise recesses 72 formed in an interconnect substrate 62A. The recesses 72 are sized and shaped to retain the bumped component contacts 60A. The interconnect contacts 58A also include conductive layers 66A covering the recesses 72, and penetrating projections 64A formed within the recesses 72. The conductive layers 66A are in electrical communication with conductors (not shown) equivalent to the conductors 68 (FIG. 6), previously described. The penetrating projections 64A are configured to penetrate the bumped component contacts 60A. Insulating layers 18A insulate the conductive layers 66A.

The interconnect contacts 58A also include conductive vias 74 in electrical communication with the conductive layers 66A. The conductive vias 74 can include bumped terminal contacts 26A, such as solder balls. As will be further explained, in an alternate embodiment carrier 10B (FIG. 9D), the bumped terminal contacts 26A form the terminal contacts for the carrier.

One method for forming the conductive vias 74 comprises laser machining openings in the substrate 62A, etching the openings (e.g.,KOH or TMAH wet etch), insulating the openings with insulating layer 70A, and then filling the openings with a conductive material (e.g., metal or conductive polymer). The terminal contacts 26A can be attached to the conductive vias 74 by soldering, brazing, or welding, pre-formed metal balls to the conductive vias 74. Alternately, a ball bumper apparatus can be used to attach pre-formed metal balls to the conductive vias 74 to form the bumped terminal contacts 26A.

Further details of the interconnect 18A, interconnect contacts 58A, and conductive vias 74, including methods of fabrication, are described in U.S. patent application Ser. No.

08/993,965 filed Dec. 18, 1997, now U.S. Pat. No. 6,107, 109, entitled "Semiconductor Interconnect Having Laser Machined Contacts", which is incorporated herein by reference. A method for fabricating the interconnect contacts 58A is also described in U.S. patent application Ser. No. 08/829,193, filed Mar. 31, 1997, now U.S. Pat. No. 5,962, 921, entitled "Interconnect Having Recessed Contact Members For Testing Semiconductor Dice And Packages With Contact Bumps", which is incorporated herein by reference.

Figure 6D:
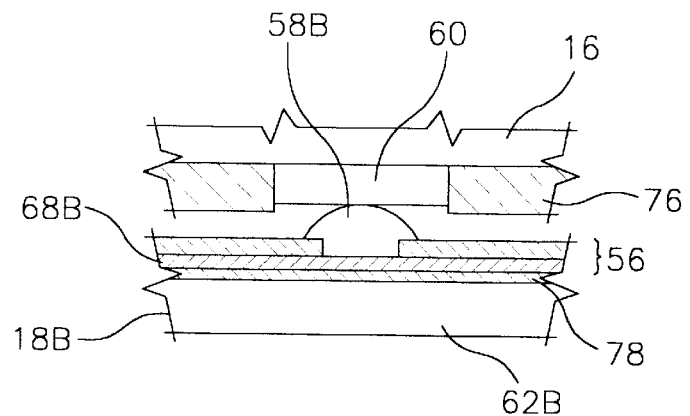
FIG. 6D is enlarged cross sectional view equivalent to FIG. 6A of another alternate embodiment interconnect contact.

Referring to FIG. 6D, an alternate embodiment interconnect 18B includes interconnect contacts 58B. The interconnect contacts 58B comprise metal microbumps formed on polymer tape 76 similar to multi layered TAB tape. In this embodiment a compliant adhesive layer 78 attaches the polymer tape 76 to a substrate 62B of the interconnect 18B. In addition, conductors 68B equivalent to conductors 68 (FIG. 6) can comprise metal foil laminated to the polymer-tape 76. Further details of the interconnect 10B, and interconnect contacts 58B, including methods of fabrication, are described in U.S. Pat. No. 5,678,301 entitled "Method For Forming An Interconnect For Testing Unpackaged Semiconductor Dice".

Referring to FIGS. 7A–7F, steps in a method for fabricating the carrier 10 are illustrated. Initially, the interconnect 18 can be provided with contacts 58, conductors 68 and bonding pads 52, substantially as shown in FIG. 6. In addition, the lead frame 14 with lead fingers 40 and mounting paddle 38 can be provided substantially as shown in FIG. 5.

Next, as shown in FIG. 7A, the interconnect 18 can be attached to the mounting paddle 38 of the lead frame 14 by forming the adhesive layer 54 between the backside of the interconnect 18, and the surface of the mounting paddle 38. The adhesive layer 54 can comprise a deposited elastomer, as previously described, or an adhesive tape. The attaching step can be performed manually, or a conventional chip attach apparatus can be used. Also, additional adhesive layers 54A can be used to attach the lead fingers 40 on the lead frame 14 to a face of the interconnect 18.

Next, as shown in FIG. 7B, a gasket 84 can be placed over the interconnect 18 and portions of the lead fingers 40. The gasket 84 will protect the surface of the interconnect 18, and the lead fingers 40, during a subsequent encapsulation step. In FIG. 5, the inner dotted rectangle represents a peripheral outline of the gasket 84. In the embodiment of FIG. 7B, the gasket 84 comprises an elastomeric material, such as silicone, that can be easily removed from the interconnect 18 following the molding step. Alternately, as will be further explained, the gasket 84 can comprise a deposited and cured polymer layer, such as a thick film resist. Still further, the gasket 84 can comprise a removable plate configured to protect the interconnect 18 and portions of the lead fingers 40.

Next, as shown in FIG. 7C, an injection mold 82 can be used to mold the carrier base 12 to the lead frame 14. A conventional molding apparatus adapted to form plastic semiconductor packages can be used to perform the molding step. The carrier base 12 forms on either side of the lead fingers 40 in a shape which is determined by the mold 82. The carrier base 12 can include all of the features as shown in FIGS. 1–3 including a size and outline corresponding to a conventional semiconductor package.

In addition to forming the carrier base 12, the molding step molds the interconnect 18 into the carrier base 12. Only the surface of the interconnect 18, which is protected by the gasket 84, remains unencapsulated by the molded base 12.

Next as shown in FIG. 7D, the lead frame 14 can be removed from the mold 82. As shown in FIG. 7E, the gasket 84 can then be removed from the interconnect 18. Removal of the gasket 84 can be accomplished using a suitable tool. If the gasket 84 comprises a deposited and cured material, removal can be with a wet etchant that will strip the gasket 84 without harming the interconnect 18.

Next, as shown in FIG. 7F, the wires 80 can be wire bonded to the bonding pads 52 (FIG. 6) on the interconnect 18, and to the lead fingers 40 on the lead frame 14. A conventional wire bonder can be used to perform the wire bonding step. Prior to the wire bonding step it may be necessary to clean the surface of the interconnect 18 with a cleaning agent that will remove contaminants. It may also be necessary to remove any mold flash that could affect the wire bonds.

Following wire bonding, a trim and form step can be performed to shape the exposed portions of the lead fingers 40 into the terminal leads 26 (FIG. 1) for the carrier 10. In addition, the lead frame 14 can be cut into a plurality of separate carriers 10. In each of the illustrative steps, conventional equipment, used to form conventional plastic semiconductor packages, can be employed.

Referring to FIGS. 8A–8E, steps in a method for fabricating an alternate embodiment carrier 10A (FIG. 8E) are illustrated. Initially as shown in FIG. 8A, the interconnect 18 can be attached to the mounting paddle 38 of the lead frame 14 using the adhesive layer 54.

Next, as shown in FIG. 8B, the wires 80 can be wire bonded to the bonding pads 52 (FIG. 6) on the interconnect 18 and to the lead fingers 40 on the lead frame 14.

Next, as shown in FIG. 8C, a polymer layer 86 can be formed on the face of the interconnect 18. As with the gasket 84 (FIG. 7B), the polymer layer 86 will protect the interconnect 18 during a subsequent molding step. One suitable polymer for forming the polymer layer 86 comprises a thick film resist sold by Shell Chemical under the trademark "EPON RESIN SU-8". The resist also includes an organic solvent (e.g., gamma-butyloracton), and a photoinitiator. The resist can be deposited to a thickness of from about 3–50 mils. A conventional resist coating apparatus, such as a spin coater, or a meniscus coater, along with a mask or stencil, can be used to deposit the resist in viscous form onto the interconnect 18. The deposited resist can then be hardened by heating to about 95° C. for about 15 minutes or longer.

Next, as shown in FIG. 8D, a plastic base 12A can be molded to the lead frame 14 and the interconnect 18, substantially as previously described for base 12 in FIG. 7C. During the molding step, the polymer layer 86 protects the interconnect 18, particularly the interconnect contacts 58 (FIG. 6). However, in this embodiment the wires 80 can be encapsulated within the plastic base 12A.

Next, as shown in FIG. 8E, the polymer layer 86 can be stripped to complete the carrier 10A. A suitable wet etchant for stripping the previously described resist formulation is a solution of PGMEA (propyleneglycol-monomethylether-acetate).

Referring to FIGS. 9A–9D, steps in a method for fabricating an alternate embodiment carrier 10B (FIG. 9D) are illustrated. Initially, an interconnect 18A fabricated as previously shown and described in FIG. 6B is provided. The interconnect 18A includes recessed interconnect contacts 58A and conductive vias 74 also as previously described. In addition, lead frame 14A having lead fingers 40A is provided. Preferably the lead frame 14A has a lead on chip configuration in which the lead fingers 40A rather than a mounting paddle support the interconnect 18A.

As shown in FIG. 9A, the interconnect 18A can be attached to the lead fingers 40A by forming an adhesive layer 54A therebetween.

Next, as shown in FIG. 9B, a polymer layer 86 can be formed as previously described to protect the interconnect 18A and interconnect contacts 58A.

Next, as shown in FIG. 9C, a plastic body 12B can be formed using a molding process as previously described. Again the interconnect 18A is molded into the body 12B, but in this embodiment the back side of the interconnect 18A is exposed. Following encapsulation, the terminal contacts 26A such as solder or conductive polymer balls, can be formed on the conductive vias 74. The terminal contacts 26A can be attached by soldering, brazing or welding pre-formed balls, or by attaching pre-formed balls using a ball bumper apparatus. Advantageously, the terminal contacts 26A can be formed in a dense array on the interconnect 18A, such as a ball grid array (BGA), or a fine ball grid array (FBGA).

Also in this embodiment, the lead fingers 40A provide a structural function, but do not necessarily provide an electrical function. Electrical communication from the outside can be through the terminal contacts 26A and conductive vias 74 to the contacts 58A. However, if desired, the lead fingers 40A can be electrically connected to select contacts 58A, such as to provide power or ground connections. In this case an electrically conductive polymer, such as a Z-axis epoxy can be used to electrically connect the lead fingers 40A to conductors in electrical communication with the contacts 58A.

Next, as shown in FIG. 9D the polymer layer 86 can be stripped, as previously described to complete the carrier 10B.

Referring to FIGS. 10A and 10B, an alternate embodiment carrier 10C is illustrated. The carrier 10C comprises a board 90 containing a plurality of interconnects 18C. The interconnects 18C are molded, or laminated, to the board 90 and include interconnect contacts 58A formed as previously described. The interconnect contacts 58A are in electrical communication with an electrical connector 94, such as an edge connector, formed on the board 90. Surface conductors (not shown) on the board 90, or internal conductors (not shown) within the board 90 electrically connect the interconnect contacts 58A to the electrical connector 94 on the board 90. In addition, wire bonds as previously described, can be used to electrically connect the interconnect contacts to the electrical connector 94, or to conductors in electrical communication with the electrical connector 94. Also gaskets, or deposited polymer layers, can be used to protect the interconnects 18C during molding or lamination of the board.

In the illustrative embodiment, the board 90 comprises a glass filled resin such as an epoxy glass (FR-4), a polyimide glass or a cyanate-glass material. In addition to being electrically insulating and structurally rigid, these materials can be laminated, cured, and then metallized using deposition and photolithography processes. Also, required features can be punched or machined using processes employed in the fabrication of printed circuit boards (PCB), and other electronic devices.

Alternately, rather than the above materials, the board 90 can comprise an electronics grade plastic, such as polyetherimide (PES), polyethersulfone (PES), polyether-ether ketone (PEEK), polyphenylene sulfide (PPS), or a liquid crystal polymer (LCP). With these plastics the board 90 can be shaped and metallized using a molding process such as 3-D injection molding.

Alternately, the board 90 can comprise ceramic. With ceramic, a ceramic lamination and metallization process can be used to construct the board 90. As another alternative, the board 90 can comprise silicon, or other semiconducting material. With silicon, etching, micromachining, and metallization processes used for semiconductor circuit fabrication can be used to construct the board 90.

As shown in FIG. 10B, a lid 22C and a spring 20C, are associated with each interconnect 18C. The lids 22C and springs 20C can be formed substantially as previously described for lid 22 (FIG. 1A) and spring 20 (FIG. 1A). In addition, a vacuum passage 96 can be formed through the lid 22C and the spring 20C for retaining a component 16A for assembly on the board 90.

As shown in FIG. 10B, the board 90 also includes a plurality of clip members 92 associated with each interconnect 18C. The clip members 92 comprise resilient metal or plastic members that can either be molded integrally with the board, or attached with suitable fasteners. With the component 16A placed on the interconnect 18C, the clip members 92 hold the component 16A in place for testing.

The component 16A can be assembled to the spring 20C, and aligned with the interconnect 18C using optical alignment techniques. U.S. Pat. No. 5,634,267, entitled "Method And Apparatus For Manufacturing Known Good Semiconductor Die", which is incorporated herein by reference, describes a method of optical alignment.

Thus the invention provides an improved semiconductor carrier and method of fabrication. Although the invention has been described with reference to certain preferred embodiments, as will be apparent to those skilled in the art, certain changes and modifications can be made without departing from the scope of the invention, as defined by the following claims.

We claim:

1. A test carrier for semiconductor components comprising:
    a board comprising an electrical connector;
    a plurality of interconnects on the board, each interconnect comprising a substrate molded to the board comprising a plurality of first contacts in electrical communication with the electrical connector configured to electrically engage a plurality of second contacts on a component; and
    a plurality of clip members attached to the board configured to retain the components on the interconnects.

2. The carrier of claim 1 wherein the board comprises plastic.

3. The carrier of claim 1 wherein the board comprises a laminated glass resin material.

4. A test carrier for testing a semiconductor component having a plurality of component contacts comprising:
    a board comprising an electrical connector; and
    an interconnect molded to the board comprising a substrate and a plurality of interconnect contacts on the substrate in electrical communication with the electrical connector configured to make temporary electrical connections with the component contacts.

5. The test carrier of claim 4 wherein the component contacts comprise planar pads and the interconnect contacts comprise raised members having penetrating projections at least partially covered with conductive layers.

6. The test carrier of claim 4 wherein the component contacts comprise balls and the interconnect contacts comprise recesses at least partially covered with conductive layers.

7. The test carrier of claim 4 further comprising a clip member attached to the board configured to retain the component on the interconnect.

8. A test carrier for testing a semiconductor component having a plurality of component contacts comprising:

a plastic board comprising an electrical connector;

an interconnect molded to the plastic board comprising a surface and a plurality of interconnect contacts on the surface in electrical communication with the electrical connector configured to make temporary electrical connections with the component contacts, the interconnect at least partially encapsulated in the plastic board with the surface and the interconnect contacts unencapsulated; and a clip member configured to hold the component on the interconnect.

9. The test carrier of claim 8 wherein the component comprises a semiconductor die or a semiconductor package.

10. The test carrier of claim 8 wherein the interconnect contacts comprise projections configured to penetrate the component contacts.

11. The test carrier of claim 8 further comprising a lid and a spring on the clip member.

12. The test carrier of claim 8 wherein the clip member comprises a resilient metal molded to the plastic board.

13. The test carrier of claim 8 wherein the clip member comprises a resilient plastic molded to the plastic board.

14. The test carrier of claim 8 wherein the interconnect comprises silicon and the interconnect contacts comprise raised members at least partially covered with conductive layers.

15. The test carrier of claim 8 wherein the interconnect comprises a polymer tape and the interconnect contacts comprise microbumps on the tape.

16. The test carrier of claim 8 wherein the interconnect contacts comprise recesses in the interconnect having projections therein for penetrating the component contacts.

17. A test carrier for testing a semiconductor component having bumped contacts comprising:

a board comprising an electrical connector;

an interconnect on the board comprising a substrate and a plurality of interconnect contacts on the substrate in electrical communication with the electrical connector, the interconnect contacts comprising recesses at least partially covered with conductive layers in electrical communication with the electrical connector and configured to make temporary electrical connections with the bumped contacts, the interconnect at least partially encapsulated in the board with the interconnect contacts unencapsulated; and a plurality of clip members on the board configured to retain the component on the interconnect.

18. The test carrier of claim 17 wherein the component comprises a semiconductor package, and the bumped contacts comprise balls.

19. The test carrier of claim 17 further comprising a plurality of interconnects on the board substantially identical to the interconnect.

20. The test carrier of claim 17 wherein the board comprises molded plastic.

21. The test carrier of claim 17 wherein the board comprise a laminated glass resin material.

22. The test carrier of claim 17 further comprising a lid and a spring on each clip member.

23. The test carrier of claim 17 wherein the clip members are molded to the board.

24. The test carrier of claim 17 wherein the interconnect contacts comprise projections in the recesses configure to penetrate the bumped contacts.

* * * * *